United States Patent
Otsuka et al.

(10) Patent No.: US 7,518,154 B2
(45) Date of Patent: Apr. 14, 2009

(54) NITRIDE SEMICONDUCTOR SUBSTRATE AND SEMICONDUCTOR ELEMENT BUILT THEREON

(75) Inventors: Koji Otsuka, Niiza (JP); Masataka Yanagihara, Niiza (JP); Nobuo Kaneko, Niiza (JP)

(73) Assignee: Sanken Electric Co., Ltd., Saitama (JP)

( * ) Notice: Subject to any disclaimer, the term of this patent is extended or adjusted under 35 U.S.C. 154(b) by 50 days.

(21) Appl. No.: 10/988,889

(22) Filed: Nov. 15, 2004

(65) Prior Publication Data

US 2005/0110043 A1    May 26, 2005

(30) Foreign Application Priority Data

Nov. 21, 2003  (JP)  ............... 2003-392945

(51) Int. Cl.
*H01L 29/207* (2006.01)
(52) U.S. Cl. .................. 257/96; 257/103; 257/194; 257/E29.251
(58) Field of Classification Search .......... 257/103, 257/194, E29.251, 94, 96; 438/162, 285
See application file for complete search history.

(56) References Cited

U.S. PATENT DOCUMENTS

| 4,792,832 | A | * | 12/1988 | Baba et al. .................... 257/22 |
| 5,192,987 | A | * | 3/1993 | Khan et al. .............. 257/183.1 |
| 5,393,993 | A | * | 2/1995 | Edmond et al. ................ 257/77 |
| 5,727,008 | A | * | 3/1998 | Koga ........................ 372/43.01 |
| 5,739,554 | A | * | 4/1998 | Edmond et al. ............. 257/103 |
| 5,880,485 | A | * | 3/1999 | Marx et al. .................... 257/94 |
| 6,841,001 | B2 | * | 1/2005 | Saxler .......................... 117/84 |
| 7,112,830 | B2 | * | 9/2006 | Munns ........................ 257/190 |
| 2002/0167023 | A1 | * | 11/2002 | Chavarkar et al. .......... 257/194 |
| 2003/0136333 | A1 | * | 7/2003 | Semond et al. ................ 117/95 |

FOREIGN PATENT DOCUMENTS

JP    2003-059948    2/2003

* cited by examiner

*Primary Examiner*—Wael Fahmy
*Assistant Examiner*—John C Ingham
(74) *Attorney, Agent, or Firm*—Woodcock Washburn LLP (57) ABSTRACT

A substrate system of the kind having a buffer region interposed between a silicon substrate proper and a nitride semiconductor region in order to make up for a difference in linear expansion coefficient therebetween. Electrodes are formed on the nitride semiconductor layer or layers in order to provide HEMTs or MESFETs. The buffer region is a lamination of a multiplicity of buffer layers each comprising a first, a second, and a third buffer sublayer of nitride semiconductors, in that order from the silicon substrate proper toward the nitride semiconductor region. The three sublayers of each buffer layer contain aluminum in varying proportions including zero. The aluminum proportion of the third buffer sublayer is either zero or intermediate that of the first buffer sublayer and that of the second. The low aluminum proportion of the third buffer sublayer serves to prevent two-dimensional electron gas from generating in the buffer region and hence to make this region sufficiently high in resistance to inhibit current leakage from the HEMTs or MESFETs.

15 Claims, 4 Drawing Sheets

FIG. 1

PRIOR ART

FIG. 2

PRIOR ART

NITRIDE SEMICONDUCTOR SUBSTRATE AND SEMICONDUCTOR ELEMENT BUILT THEREON

CROSS REFERNCE TO RELATED APPLICATIONS

This application claims priority to Japanese Patent Application No.2003-392945, filed Nov. 21, 2003.

BACKGROUND OF THE INVENTION

This invention relates to a substrate well adapted for fabrication of nitride semiconductor elements typically including high-electron-mobility transistors (HEMTs) and metal-semiconductor-field-effect transistors (MESFETs), to a method of making the semiconductor substrate, and to a semiconductor element including the substrate.

The substrate for use in fabrication of nitride semiconductor elements has a baseplate, or substrate proper, which is usually made from such familiar substances as sapphire, silicon carbide, or silicon. A nitride semiconductor layer or layers for the desired elements are grown epitaxially on the substrate proper. Being less expensive, silicon is preferable to sapphire and silicon carbide, as disclosed in Japanese Unexamined Patent Publication No. 2003-59948. Silicon is not, however, wholly satisfactory as a substrate material: There is an inconveniently great difference in linear expansion coefficient between the silicon substrate proper and the nitride semiconductor layer or layers. The nitride semiconductor layer or layers had been easy to be stressed as a result, with the consequent development of cracks and transitions.

In order to remedy this difficulty, the above cited patent application proposed an interposition of a multilayered buffer region between the silicon substrate proper and the nitride semiconductor layer or layers, the latter being grown epitaxially on the interposed buffer region. The multilayered buffer region favorably performed the purposes for which it was intended, mitigating the stresses and reducing cracks and transitions in the nitride semiconductor layers.

It has later proved, however, that the multilayered buffer region possessed its own shortcomings. Let us consider for example the case where the buffer region takes the form of several alternations of a relatively thin layer of aluminum nitride (AlN) and a thicker layer of gallium nitride (GaN). The GaN layers are higher in lattice constant than the AlN layers. As a consequence, if the heterostructure was distorted without lattice loosening, tensile stress would be applied to the overlying AlN layers, with the consequent creation of polarization charges at the heterojunctions. Two-dimensional electron gas layers would then be created in the GaN layers, as will be later explained in more detail with reference to the attached drawings.

The two-dimensional electron gas layers would make the GaN layers extremely low in resistance in their own planes. Thus the prior art multilayered buffer region provided a path of leakage current for the semiconductor elements created thereon and so actually invited an increase in the amount of leakage current.

For fabrication of desired semiconductor elements on the substrate, there is formed on the multilayered buffer region a main semiconductor region for such elements, in addition to a source electrode, drain electrode, and gate electrode for each element. The main semiconductor region is a lamination of what are known to the specialists as an electron transit layer and an electron supply layer in the case of HEMTs. The low resistance of the buffer region resulted in a flow of leakage current along the path sequentially comprising the source electrode, electron supply layer, electron transit layer, buffer region, electron transit layer, electron supply layer, and drain electrode, when a control signal is impressed to the gate of the HEMT to cause nonconduction therethrough. This current leakage is altogether undesirable and should be reduced to a minimum, not only in HEMTs but in MESFETs and other semiconductor elements of comparable design as well.

Hereinafter in this specification the term "substrate proper" will be used to refer to the baseplate of silicon or the like. The term "substrate system" will then refer to the combination of the baseplate, the multilayered buffer region thereon, and the main semiconductor region of one or more layers. The substrate system might also be termed a semiconductor body.

SUMMARY OF THE INVENTION

The present invention seeks, in the substrate system of the kind under consideration, to prevent the buffer region, which is interposed between the substrate proper and the main semiconductor region, from becoming unnecessarily low in resistance and hence to reduce the amount of leakage current flowing therethrough.

Briefly, the invention may be summarized as a substrate system for fabrication of a semiconductor element, comprising a substrate proper, a buffer region formed on a major surface of the substrate proper, and a main semiconductor region formed on the major surface of the substrate proper via the buffer region and having at least one nitride semiconductor layer for a desired semiconductor element.

The invention particularly features the noted buffer region, which has one or more buffer layers each in the form of three buffer sublayers in lamination. The three buffer sublayers constituting each buffer layer are: (a) a first buffer sublayer of a first nitride semiconductor containing aluminum in a first proportion; (b) a second buffer sublayer of a second nitride semiconductor containing aluminum in a second proportion which is either zero or less than the first proportion, the second buffer sublayer being arranged next to the first buffer sublayer and farther away from the substrate proper than is the first buffer sublayer; and (c) a third buffer sublayer of a third nitride semiconductor containing aluminum in a third proportion which is intermediate the first and the second proportion, the third buffer sublayer being arranged next to the second buffer sublayer and farther away from the substrate proper than is the second buffer sublayer.

In short the first buffer sublayer is fabricated from a nitride semiconductor containing aluminum; the second buffer sublayer from a nitride semiconductor which either does not contain aluminum or which does contain aluminum in a proportion less than the aluminum proportion of the first buffer sublayer; and the third buffer sublayer containing aluminum in a proportion that is less than the aluminum proportion of the first buffer sublayer and greater than that of the second buffer sublayer. In practice there may be provided from two to as many as 200, preferably from 20 to 80, buffer layers in lamination.

Newly introduced by the instant invention, the third buffer sublayer functions to reduce the amount of two-dimensional electron gas or two-dimensional hole gas which generated in the prior art substrate system having a lamination of buffer layers each consisting of two sublayers. The generation of two-dimensional electron gas or two-dimensional hole gas due to the heterojunctions between the second and third buffer sublayers is materially curtailed according to the invention. The buffer region constituted of alternations of the three buffer sublayers according to the invention is thus prevented from becoming so low in electrical resistance as to provide paths for current leakage from the semiconductor elements fabricated thereon.

Additional advantages of the invention arise from the aluminum contents of the first and third buffer sublayers. These aluminum-containing sublayers serve to improve the crystallinity of the second buffer sublayers, which may, or may not, contain aluminum, and the crystallinity and levelness of the nitride semiconductor region formed on the topmost third buffer sublayer.

Another preferred form of substrate system according to the invention incorporates a fourth sublayer between the first and the second sublayer of each buffer layer. The fourth buffer sublayer is of a fourth nitride semiconductor containing aluminum in a fourth proportion which is intermediate the first and the second proportion. This buffer configuration even more effectively diminishes the amount of two-dimensional electron gas or two-dimensional hole gas.

Let us assume that, as is preferred by the invention, a plurality or multiplicity of buffer layers, each comprising the first to third, or first to fourth, sublayers of the above specified arrangement, are laminated to make up the buffer region. Then, were it not for the third buffer sublayers, the second sublayer of each buffer layer would come into direct contact with the first sublayer of the next buffer layer. The heterojunctions between the first and the second buffer sublayers would give rise to two-dimensional electron gas or two-dimensional hole gas and so lower the resistance of the buffer region. Interposed between the first and the second sublayers of the neighboring buffer layers, the third buffer sublayers according to the invention effectively precludes the generation of two-dimensional electron gas or two-dimensional hole gas.

The above and other objects, features and advantages of this invention will become more apparent, and the invention itself best understood, from the following description of some preferable embodiments taken together with the attached drawings.

DETAILED DESCRIPTION

Figure 1:
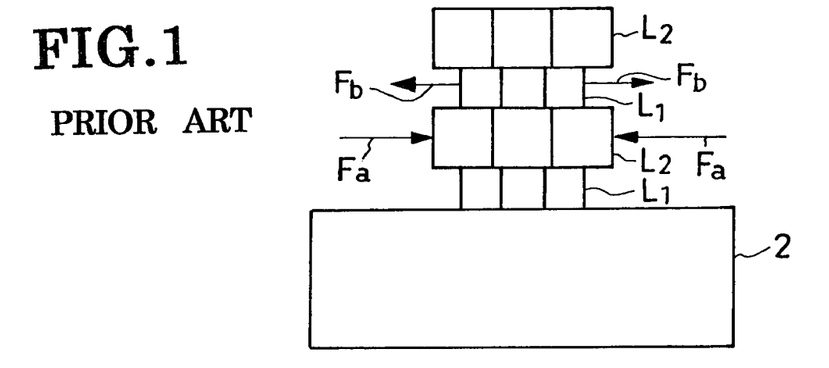
FIG. 1 is a schematic illustration of how two-dimensional electron gas generated in the buffer region of the prior art substrate system closest to the instant invention.
Figure 2:
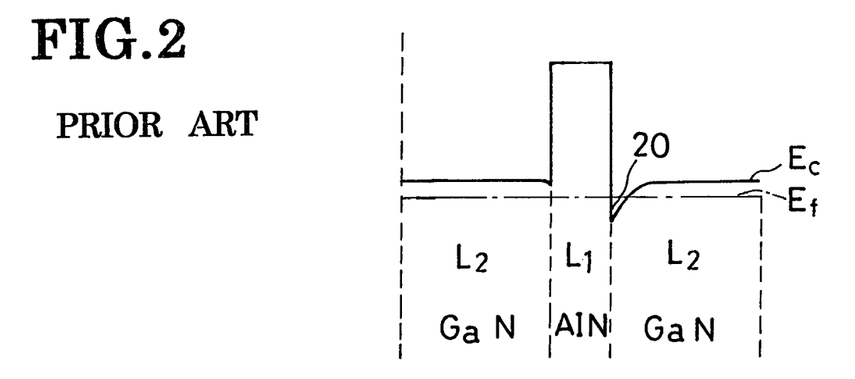
FIG. 2 is a diagram of the energy band of the prior art buffer region of FIG. 1.

The problem encountered with the noted prior art will be discussed in some more detail with reference to FIGS. 1 and 2 of the above drawings. Shown in FIG. 1 is a silicon substrate 2 having formed thereon a lamination of alternating AlN layers $L_1$ and GaN layers $L_2$ according to the prior art. The upright lines drawn across the layers $L_1$ and $L_2$ represent lattice magnitude. It is thus seen that the AlN layers $L_1$ are less in lattice constant than the GaN layers $L_2$. Tensile stresses were exerted upon the AlN layers $L_1$ overlying the GaN layers $L_2$, as indicated by the arrows designated $F_b$, if the heterostructure of each AlN layer $L_1$ and underlying GaN layer $L_2$ was strained without lattice loosening. The tensile stresses caused piezoelectric field polarization at the heterojunctions, in addition to spontaneous polarization caused by the materials constituting the heterostructure. A layer of two-dimensional electron gas was thus generated at the upper part of each GaN layer $L_2$. The two-dimensional electron gas layer occurs at 20 in FIG. 2 where the conduction band $E_c$ drops below the Fermi level $E_f$.

Two-dimensional electron gas layers are less prone to occur at the heterojunctions between the GaN layer $L_2$ and the underlying AlN layer $L_1$. This is because the GaN layer $L_2$ is subject to compressive stress indicated by the arrow $F_a$ in FIG. 1, with the result that piezoelectric field polarization generates in opposite directions in the AlN and GaN layers, greatly modulating the band.

The two-dimensional electron gas layers generated as above in the GaN layers $L_2$ made the GaN layers extremely low in resistance in their own planes. Thus the prior art multilayered buffer region provided paths for current leakage and so actually gave rise to a significant increase in the amounts of leakage current from the semiconductor elements created thereon.

Figure 3:
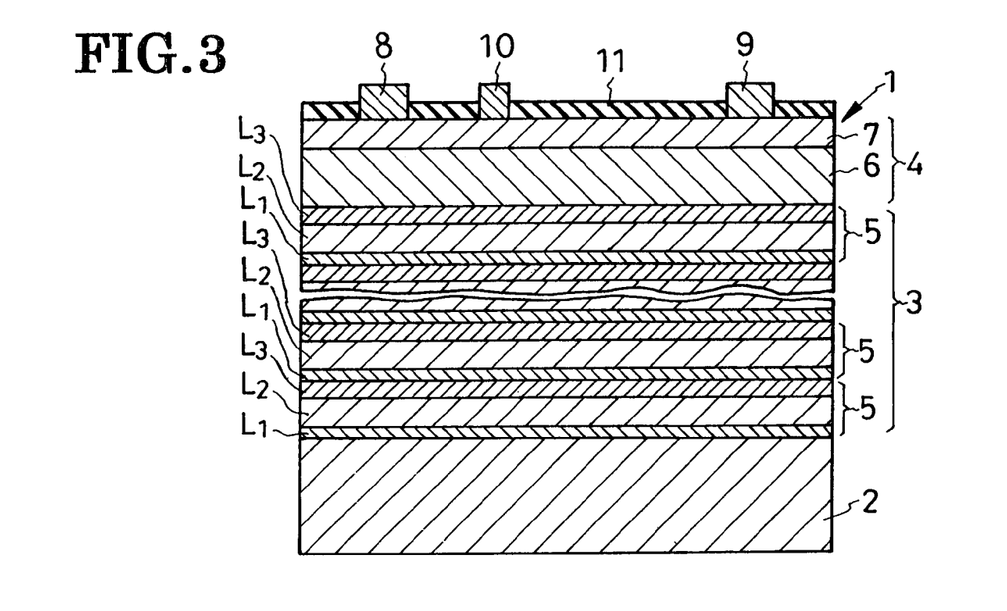
FIG. 3 is a section, partly broken away for illustrative convenience, through a HEMT built on a preferred form of substrate system according to the invention.
Figure 4:
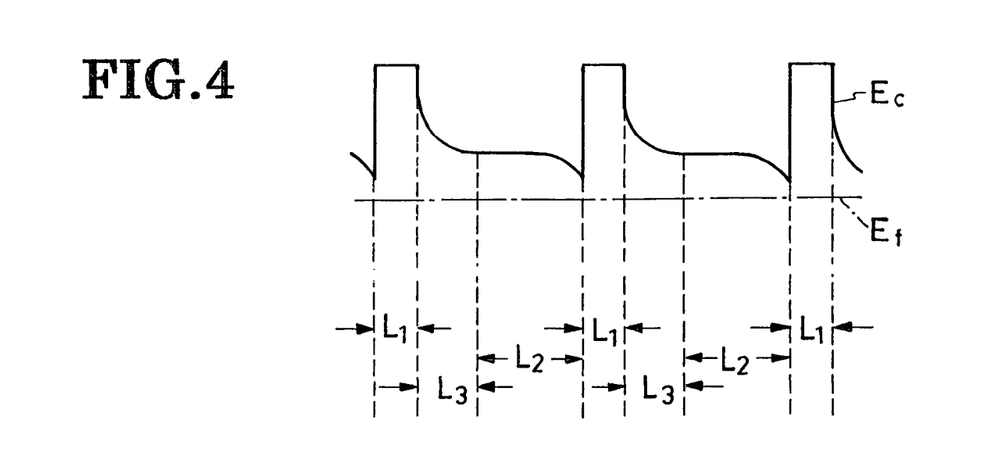
FIG. 4 is an energy band diagram of the buffer region of the improved substrate system of FIG. 3.
Figure 5:
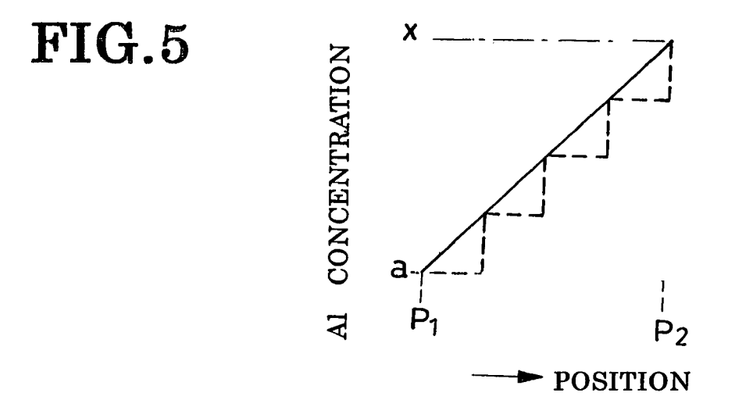
FIG. 5 is a graph plotting the aluminum concentration of each third buffer sublayer of the buffer region of the improved substrate system of FIG. 3 in its thickness direction.

Embodiment of FIGS. 3-5

The present invention is believed to be best embodied in the substrate system shown sectioned in FIG. 3 together with a HEMT fabricated thereon, the HEMT being a familiar type of semiconductor element capable of controlling current flow between its source and drain electrodes. Generally designated 1, the semiconductor body or substrate system comprises a baseplate or substrate proper 2, a buffer region 3, and a main semiconductor region 4 constituting a primary working part of the HEMT.

The buffer region 3, constituting the gist of this invention, takes the form of a lamination of a plurality of buffer layers 5 each constituted of three buffer sublayers $L_1$, $L_2$ and $L_3$. The main semiconductor region 4 comprises an electron transit layer 6 and electron supply layer 7. Formed on the substrate system 1 for providing the HEMT are a source electrode 8, drain electrode 9 and gate electrode 10, which are electrically insulated from one another by an insulating film 11 overlying the main semiconductor region 4.

The substrate proper 2 is of a single crystal of n-type silicon with an addition of phosphorus or other Group V elements of Periodic Table as a conductivity type determinant. That surface of the substrate proper 2 which has the buffer region 3 formed thereon is the (111) face in terms of the Miller indices identifying a type of crystal plane. The substrate proper 2 has an impurity concentration of as low as, say, from $1 \times 10^{12}$ to $1 \times 10^{14}$ cm$^{-3}$ with a view to reduction of leakage current flowing through the substrate-system 1, and a resistivity of as high as, say, from 100 to 10,000 ohm-centimeters. Approximately 500 micrometers thick, the substrate proper 2 provides a mechanical support for the overlying buffer region 3 and semiconductor region 4.

The buffer region 3 is interposed between substrate proper 2 and main semiconductor region 4 in order to improve the crystallinity and levelness of the latter. From two to 200, preferably from 20 to 80, buffer layers 5, each composed as aforesaid of the three buffer sublayers $L_1$, $L_2$ and $L_3$, are laminated to make up the buffer region 3. It is understood that twenty buffer layers 5 are superposed one upon another in this particular embodiment of the invention, although only three of them are depicted in complete form in FIG. 3 for illustrative convenience.

Overlying the silicon substrate proper 2 and third buffer sublayers $L_3$, the first buffer sublayers $L_1$ should each be fabricated from a material that is intermediate in linear expansion coefficient between the silicon substrate proper 2 and the main semiconductor region 4. The main semiconductor region 4 of a nitride semiconductor material will suffer less cracks and less dislocations if there is little difference in linear expansion coefficient between the first buffer sublayers $L_1$ and the main semiconductor region 4. Toward this end the first buffer sublayers $L_1$ can be fabricated from materials that are expressed by the general formula:

$$Al_x M_y Ga_{1-x-y} N$$

where M is at least either of indium (IN) and boron (B); x is a numeral that is greater than zero and equal to or less than one; y is a numeral that is equal to or greater than zero and less than one; and (x+y) is equal to or less than one.

In short the first buffer sublayers $L_1$ can be made from a nitride semiconductor containing aluminum, preferred examples being aluminum nitride (AlN), aluminum indium nitride (AlInN), aluminum gallium nitride (AlGaN), aluminum indium gallium nitride (AlInGaN), aluminum boron nitride (AlBN), aluminum boron gallium nitride (AlBGaN), and aluminum boron indium gallium nitride (AlBInGaN). Employed from among these preferred examples as the material for the first buffer sublayers $L_1$ in this particular embodiment of the invention is AlN, a compound obtained by substituting 1 for the suffix x in the formula above.

The first buffer sublayers $L_1$ are closer in both lattice constant and thermal expansion coefficient to the silicon substrate proper 2 than the second buffer sublayers $L_2$. The first buffer sublayers $L_1$ should desirably be less in lattice constant than the second buffer sublayers $L_2$. Each first buffer sublayer $L_1$ should be from about 0.5 to about 50 nanometers thick. If the first buffer sublayers $L_1$ had a thickness below the lower limit of this thickness range, the main semiconductor region 4 would not be created with sufficient levelness on the resulting buffer region 3. Above the upper limit of the thickness range, on the other hand, the first buffer sublayers $L_1$ would crack owing to tensile stresses due to a difference in lattice constant between the first and second buffer sublayers $L_1$ and $L_2$ and to a difference in thermal expansion coefficient between the lowermost first buffer sublayer $L_1$ and the substrate proper 2.

Intended to enhance the buffering capabilities of the buffer region 3, the second buffer sublayers $L_2$ are fabricated from a nitride semiconductor that either does not contain aluminum or does contain aluminum in a less proportion than does the nitride semiconductor of the first buffer sublayers $L_1$. The nitride semiconductors meeting these requirements are expressed by the general formula:

$$Al_a M_b Ga_{1-a-b} N$$

where M is at least either of indium and boron; a is a numeral that is equal to or greater than zero and less than one; b is a numeral that is equal to or greater than zero and less than one; (a+b) is equal to or less than one; and a is less than x.

Preferred examples of nitride semiconductors defined by this formula include gallium nitride (GaN), aluminum indium nitride (AlInN), aluminum gallium nitride (AlGaN), aluminum indium gallium nitride (AlInGaN), aluminum boron nitride (AlBN), aluminum boron gallium nitride (AlBGaN), and aluminum boron indium gallium nitride (AlBInGaN). Out of these, the particular substance employed for the second buffer sublayers $L_2$ in this embodiment of the invention is GaN, the nitride obtained by substituting zero for the suffix a in the formula above.

Preferably, in order to keep the second buffer sublayers $L_2$ from cracking, the aluminum proportion a in the formula above should be equal to or greater than zero and less than 0.2. Also, the aluminum proportion a should be less than both of the aluminum proportion x in the foregoing formula defining materials for the first buffer sublayers $L_1$ and the aluminum proportion i in the formula, to be given subsequently, defining materials for the third buffer sublayers $L_3$.

Each second buffer sublayer $L_2$ should be from 0.5 to 500 nanometers thick. Should the second buffer sublayers $L_2$ have a thickness below the lower limit of this thickness range, neither the first buffer sublayers $L_1$ on these second buffer sublayers $L_2$ nor the main semiconductor region 4 on the entire buffer region 3 would be created with a desired degree of levelness. Above the upper limit of the thickness range, on the other hand, the desired stress mitigation effect of the alternating first and second buffer sublayers $L_1$ and $L_2$ would lessen, resulting in the development of cracks. It is also desired that the second buffer sublayers $L_2$ be made thicker than the first buffer sublayers $L_1$. The first buffer sublayers $L_1$ will then be saved from cracking owing to tensile stresses due to a difference in lattice constant between the first and second buffer sublayers $L_1$ and $L_2$ and to a difference in thermal expansion coefficient between the lowermost first buffer sublayer $L_1$ and the substrate proper 2.

The third buffer sublayers $L_3$ overlying the second buffer sublayers $L_3$ are designed to reduce the generation of two-dimensional electron gas to a minimum. Materials adoptable for these third buffer sublayers are defined by the general formula:

$$Al_i B_j Ga_{1-i-j} N$$

where i is greater than zero and less than one; j is equal to or greater than zero and less than one; (i+j) is equal to or less than one; and i is greater than a and less than x.

Preferred examples of nitride materials for the third buffer sublayers $L_3$, defined by the formula above, include AlGaN, AlInN, AlInGaN, AlBN, AlBGaN, and AlBInGaN. The particular nitride employed for the third buffer sublayers $L_3$ in this embodiment of the invention is $Al_i Ga_{1-i} N$.

The aluminum proportion i of the third buffer sublayers $L_3$ is less than the aluminum proportion x of the first buffer sublayers $L_1$ and greater than the aluminum proportion a of the second buffer sublayers $L_2$. That is, the aluminum proportion i of the third buffer sublayers $L_3$ is a value intermediate the aluminum proportion a of the second buffer sublayers $L_2$ and the aluminum proportion x of the first buffer sublayers $L_1$. When the aluminum proportion a of the second buffer sublayers $L_2$ is zero, the aluminum proportion i of the third buffer sublayers $L_3$ is a value intermediate zero and the aluminum proportion x of the first buffer sublayers $L_1$. The third buffer sublayers $L_3$ are closer in lattice constant and thermal expansion coefficient to the silicon substrate proper 2 than are the second buffer sublayers $L_2$. The third buffer sublayers $L_3$ should desirably be less in lattice constant than the second buffer sublayers $L_2$.

Each third buffer sublayer $L_3$ should be from 0.5 to 50 nanometers thick. Should the thickness of the second buffer sublayers $L_2$ be below the lower limit of this thickness range, the main semiconductor region 4 on the entire buffer region 3 would not be created with a desired degree of levelness. Above the upper limit of the thickness range, on the other hand, the third buffer sublayers $L_3$ would develop cracks from tensile stresses due to a difference in lattice constant between the second and third buffer sublayers $L_2$ and $L_3$ and to a difference in thermal expansion coefficient between the substrate proper 2 and the third buffer sublayers $L_3$.

The proportion i of aluminum in the nitride materials for the third buffer sublayers $L_3$ may be constant throughout the thickness of each third buffer sublayer. Preferably, as graphically drawn in FIG. 5, the aluminum proportion i may rise either linearly, as indicated by the solid line, or stepwise, as indicated by the broken line, from the first point $P_1$ closest to the substrate proper 2 to the second point $P_2$ farthest away therefrom. It is also preferred that the aluminum proportion i of each third buffer sublayer $L_3$ at the first point $P_1$ be the same as the aluminum proportion a of the underlying second buffer sublayer $L_2$, and that the aluminum proportion i at the second point $P_2$ be the same as the aluminum proportion x of the overlying first buffer sublayer $L_1$. With the aluminum proportion i of each third buffer sublayer $L_3$ varied either linearly or stepwise as above, the mean value of this aluminum proportion in the thickness direction of each third buffer sublayer is midway between the aluminum proportion x of the first buffer sublayers $L_1$ and the aluminum proportion a of the second buffer sublayers $L_2$.

With reference back to FIG. 3 the main semiconductor region 4 for the HEMT is constituted as aforesaid of the electron transit layer 6 and electron supply layer 7. In this particular embodiment the electron transit layer 6 is of GaN, undoped with impurities, whereas the electron supply layer 7 is of n-type $Al_{0.2}Ga_{0.8}N$, doped with silicon as n-type impurities. More broadly, these layers 6 and 7 can be of gallium nitride-based compound semiconductors. Directly overlying the buffer region 3, the electron transit layer 6 provides a channel for electron flow. The electron supply layer 7 on the electron transit layer 6 supplies thereto the electron generated from donor impurities (n-type impurities). The electron transit layer 6 may be 500 nanometers thick, and the electron supply layer 7 may be 30 nanometers thick. As required or desired, a spacer layer might be interposed between electron transit layer 6 and electron supply layer 7 in order to keep the silicon doping of the electron supply layer from diffusing into the electron transit layer.

The three electrodes 8, 9 and 10 are formed on the main semiconductor layer 4 to make up a HEMT. Of these, the source 8 and drain 9 make ohmic contact with the electron supply layer 7 whereas the gate 10 makes Schottky-barrier contact therewith. A contact layer of high n-type impurity concentration could be provided between the source 8 and drain 9 and the electron supply layer 7. The insulating film 11 of silicon dioxide or the like covers the surface of the main semiconductor region 4, leaving only the electrodes 8-10 exposed.

Being so thin, the electron supply layer 7 functions as insulator in its own plane and as conductor in its thickness direction. Therefore, in the operation of the HEMT, electrons flow through the source 8, electron supply layer 7, electron transit layer 6, electron supply layer 7, and drain 9, in that order. This electron flow, or current, is controlled by a voltage impressed to the gate 10.

What follows is a detailed presentation of a method adopted for fabricating the HEMT of the FIG. 3 configuration. The first buffer sublayers $L_1$ were of AlN, the second buffer sublayers $L_2$ of GaN, and the third buffer sublayers $L_3$ of AlGaN, in the HEMT made by this method. There was first prepared the silicon substrate proper 2 in the form of a thin plate. That one of the opposite major surfaces of the silicon substrate proper 2 on which there was to be formed the buffer region 3 was exactly (111) of the Miller indices. In practice, however, deviations in the range of $-4°$ to $+4°$ are permissible.

Then the buffer region 3 was formed on the predetermined major surface of the substrate proper 2 by alternately and repeatedly forming the AlN sublayers $L_1$, GaN sublayers $L_2$, and AlGaN sublayers $L_3$ by the known epitaxial growth method of metal organic chemical vapor deposition (MOCVD). For such epitaxial grow of the buffer sublayers $L_1$-$L_3$ by the MOCVD method, the silicon substrate proper 2 was first pretreated with a hydrofluoric etchant. Then, introduced into the reaction chamber of the MOCVD apparatus, the substrate proper 2 was stripped of surface oxide films by being thermally annealed at 1100° C. for about 10 minutes. Then both trimethyl aluminum (TMA) gas and ammonia ($NH_3$) gas were charged into the reaction chamber, thereby causing AlN to be grown epitaxially to a thickness of approximately five nanometers on one of the major surfaces of the substrate proper 2. One first buffer sublayer $L_1$ was thus formed.

Then both trimethyl gallium (TMG) gas and $NH_3$ gas were introduced into the reaction chamber, thereby causing GaN to be grown epitaxially to a thickness of approximately 20 nanometers on the first buffer sublayer $L_1$. One second buffer sublayer $L_2$ was thus formed. The TMG gas was supplied at a rate of 70 micromoles per minute, and the $NH_3$ gas at a rate of 0.11 moles per minute.

Then, into the same reaction chamber, there were supplied TMG gas and TMA gas and $NH_3$ gas, thereby causing AlGaN to be grown epitaxially to a thickness of approximately five nanometers on the surface of the second buffer sublayer $L_2$. One third buffer sublayer $L_3$ was thus formed. As the TMA gas was introduced into the reaction chamber at an increasing rate at this time, aluminum was distributed as in FIG. 5 in the third buffer sublayer $L_3$.

One buffer layer 5, comprised of the three buffer sublayers $L_1$-$L_3$, was thus created on the substrate proper 2. The foregoing process was repeated twenty times to form as many buffer layers 5, thereby completing the buffer region 3.

Next comes the step of creating the main semiconductor region 4 for a HEMT on the buffer region 3 by MOCVD. To this end, following the fabrication of the buffer region 3, there were introduced into the reaction chamber of the MOCVD apparatus both TMG and $NH_3$ gases thereby forming the electron transit layer 6 of undoped GaN to a thickness of approximately 500 nanometers on the surface of the buffer region. The TMG gas (i.e. Ga) was introduced at a rate of about 70 micromoles per minute, and the $NH_3$ gas (i.e. $NH_3$) at about 0.11 mole per minute.

Then all of TMA, TMG, $NH_3$, and silane ($SiH_4$) gases were introduced into the reaction chamber thereby forming the electron supply layer 7 of $Al_{0.2}Ga_{0.8}N$ to a thickness of about 30 nanometers on the surface of the electron transit layer 6. The TMA gas was introduced at a rate of about 5.8 micromoles per minute, the TMG gas at about 17 micromoles per minute, the ammonia gas at about 0.11 mole per minute, and the $SiH_4$ gas at about 21 nanomoles per minute.

Then there was withdrawn from the MOCVD apparatus the silicon substrate 2 proper on which there had been created as above the buffer region 3 and main semiconductor region 4. Then the insulating film 11 of silicon oxide was formed on the entire surface of the main semiconductor region 4 by the familiar plasma CVD method.

The fabrication of the substrate system 1 according to the invention was now completed. Although the substrate system is shown in FIG. 3 in association with one HEMT, actually it was in the form of a wafer, so that a multiplicity of HEMTs were jointly fabricated thereon.

The next step is the creation of HEMT electrodes 8-10 on the substrate system 1. Openings for HEMT sources and drains were first formed in the insulating film 11 by photolithography using hydrofluoric acid as an etchant. Then titanium and aluminum were successively layered by electron beam deposition. Then, after liftoff, the deposits were annealed at 650° C. for 10 minutes in an $N_2$ atmosphere, thereby completing the ohmic sources 8 and drains 9. For fabrication of gates, openings were similarly etched in the insulating film 11, and nickel and gold were deposited by electron beam deposition. The Schottky barrier gates 10 were completed after liftoff.

Then the wafer was cut into squares known as dice. There were thus completed the fabrication of individual HEMT chips (semiconductor elements).

It was assumed in the foregoing method of HEMT fabrication according to the invention that the first buffer sublayers $L_1$ were of AlN, the second buffer sublayers $L_2$ of GaN, and the third buffer sublayers $L_3$ of AlGaN. Another method was then tried in which the first buffer sublayers $L_1$ were of $Al_{0.5}In_{0.01}Ga_{0.49}N$, the second buffer sublayers $L_2$ Of $Al_{0.05}In_{0.35}Ga_{0.6}N$, and the third buffer sublayers $L_3$ of $Al_{0-0.5}In_{0.01}Ga_{0.49-0.99}N$. $Al_{0.5}In_{0.01}Ga_{0.49}N$ is a result of substitution of 0.5 for x, 0.01 for y, and In for M in the above defined formula, $Al_xM_yGa_{1-x-y}$, of the substances adoptable for the first buffer sublayers $L_1$. $Al_{0.05}In_{0.35}Ga_{0.6}N$ is a result of substitution of 0.05 for a, 0.35 for b, and In for M in the formula, $Al_aM_bGa_{1-a-b}N$, of the substances adoptable for the second buffer sublayers $L_2$. $Al_{0.05}In_{0.01}Ga_{0.49-0.99}N$ is a result of substitution of 0.0-0.5 for i, 0.01 for j, and In for M in the formula, $Al_iB_jGa_{1-i-j}N$, of the substances adoptable for the third buffer sublayers $L_3$.

For epitaxially growing the buffer sublayers $L_1$, $L_2$ and $L_3$ containing indium as above, trimethyl indium (TMIn) gas was added to the reaction chamber atmosphere that had been used as above for creation of the AlN first buffer sublayers $L_1$, GaN second buffer sublayers $L_2$, and AlGaN third buffer sublayers $L_3$. The other details of making the indium-containing buffer region 3, and the HEMTs thereon, were as previously set forth in conjunction with the first described method.

Experiment has proved that the buffer region 3 constituted of the indium-containing sublayers $L_1$-$L_3$ possesses the same advantages as does the buffer region constituted of the non-indium-containing sublayers. The indium-containing buffer region 3 offered the additional advantage of being closer in thermal expansion coefficient to the silicon substrate proper 2 than was the non-indium-containing buffer region.

Still another method was tried in which the first buffer sublayers $L_1$ were of $Al_{0.5}Ga_{0.5}N$, the second buffer sublayers $L_2$ of $B_{0.3}Ga_{0.7}N$, and the third buffer sublayers $L_3$ of $Al_{0-0.5}Ga_{0.5-1.0}N$. $Al_{0.5}Ga_{0.5}N$ is a result of substitution of 0.5 for x, 0 for y, and B for M in the above defined formula, $Al_xM_yGa_{1-x-y}N$, of the substances adoptable for the first buffer sublayers $L_1$. $B_{0.3}Ga_{0.7}N$ is a result of substitution of 0 for a, 0.3 for b, and B for M in the formula, $Al_aM_bGa_{1-a-b}N$, of the substances adoptable for the second buffer sublayers $L_2$. $Al_{0-0.5}Ga_{0.5-1.0}N$ is a result of substitution of 0.0-0.5 for i, 0 for j, and B for M in the formula, $Al_iB_jGa_{1-i-j}N$, of the substances adoptable for the third buffer sublayers $L_3$.

For epitaxially growing the buffer sublayers $L_1$, $L_2$ and $L_3$ containing boron as above, the same reaction chamber atmosphere was used as that in the above described method for creation of the AlN first buffer sublayers $L_1$, GaN second buffer sublayers $L_2$, and AlGaN third buffer sublayers $L_3$, except for the addition of triethyl boron (TEB) gas. The other details of making the buffer region 3 with the boron-containing second sublayers $L_2$, and the HEMTs thereon, were as previously set forth in conjunction with the first described method.

Experiment has proved that the boron-containing buffer region 3 possesses the same advantageous effects as does the non-boron-containing buffer region. The boron-containing second buffer sublayers $L_2$ in particular were of sturdier make than their non-boron-containing peers, developing less cracks. Boron could be added to the first and third buffer sublayers $L_1$ and $L_3$ as well.

It may be pointed out at this juncture that the proportions of aluminum particularly matter in the nitride semiconductor buffer sublayers $L_1$-$L_3$. Changes in the proportions of the other ingredients of these sublayers do not affect the performance of the buffer region 3 as do changes in aluminum proportions.

The merits offered by the improved HEMT of the FIG. 1 configuration may be recapitulated as follows:

1. Containing a relatively small proportion of aluminum, the third buffer sublayers $L_3$ of the buffer region 3 effectively inhibit or restrict the generation of two-dimensional electron gas.

2. No abrupt change in lattice constant or linear expansion coefficient occurs in the thickness direction of each buffer layer 5 as the proportion of aluminum in each third buffer sublayer $L_3$ rises as in FIG. 5 from its junction with the underlying second buffer sublayer $L_2$ toward its junction with the overlying first buffer sublayer $L_1$. The result is a diminution of defect density in the third and overlying buffer sublayers. This is because the gradual change in lattice constant of the third buffer sublayer $L_3$, results in the joining of misfit transitions occurring at the lattice planes of he third buffer sublayer $L_3$.

3. The main semiconductor region 4 is favorable in both crystallinity and levelness as the first and second buffer sublayers $L_1$ and $L_2$ are made from the same materials as in Japanese Unexamined Patent Publication No. 2003-59948, supra, and as the third buffer sublayers $L_3$ contain aluminum.

The first recited advantage of the invention will be explained in some more detail. Conventionally, as has been pointed out with reference to FIGS. 1 and 2, the first buffer sublayers $L_1$ with an aluminum proportion of as high as 0.5 or so were placed directly on the second buffer sublayers $L_2$ having a higher lattice constant. This arrangement caused the first buffer sublayers $L_1$ to be subjected to tensile stresses indicated by the arrows $F_b$ in FIG. 1, resulting in the creation of a piezoelectric polarization field at the heterojunctions. Two-dimensional electron gas was thus generated as the conduction band $E_c$ in the energy band diagram of FIG. 2 projects downwardly of the Fermi level $E_f$ at 20.

By contrast, in the substrate system of this invention as depicted in FIG. 3, there is little difference in lattice constant and linear expansion coefficient between each second buffer sublayer $L_2$ and the third buffer sublayer $L_3$ laid thereover, the latter being as low as 0.2 or less in aluminum proportion. Little tensile stresses are exerted on the third buffer sublayers $L_3$, resulting in the reduction of the piezoelectric polarization fields at the heterojunctions and hence of the two-dimensional electron gas.

It is also noteworthy that, as no abrupt change in lattice constant and linear expansion coefficient occurs as above in the thickness direction of each buffer layer 5 thanks to the linearly changing aluminum proportion across the third buffer sublayer $L_3$, no abrupt change in the conduction band $E_c$, FIG. 4, occurs at the junction between the second and third buffer sublayers $L_2$ and $L_3$. Therefore, unlike the prior art case shown in FIG. 2, the conduction band $E_c$ does not fall below the Fermi level $E_f$. The generation of two-dimensional electron gas is thus prevented. The amount of leakage current flowing through the buffer region 3 is reduced to a minimum as the region is prevented from becoming low in resistance.

Figure 6:
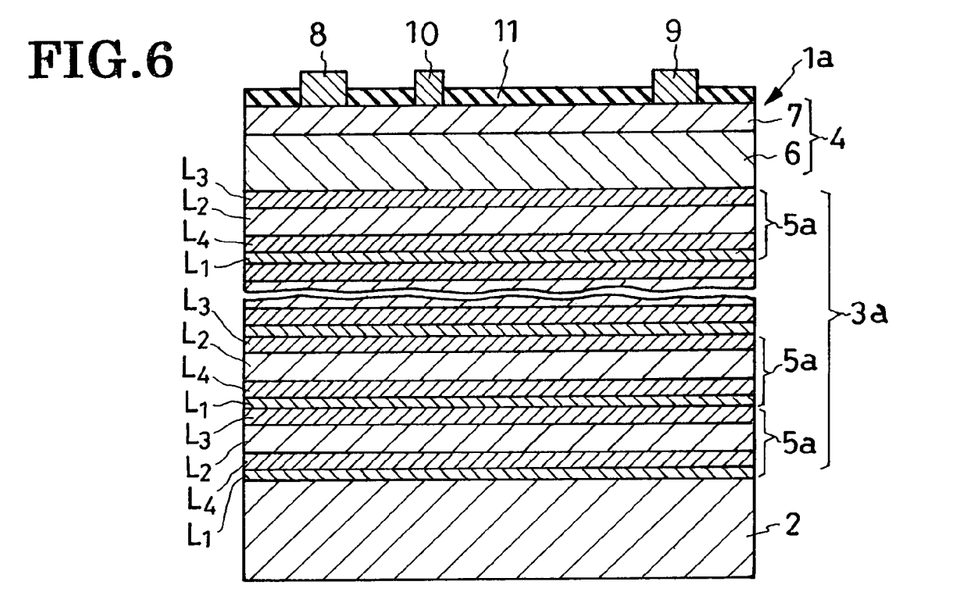
FIG. 6 is a view similar to FIG. 3 but showing a HEMT built on another preferred form of substrate system according to the invention.
Figure 7:
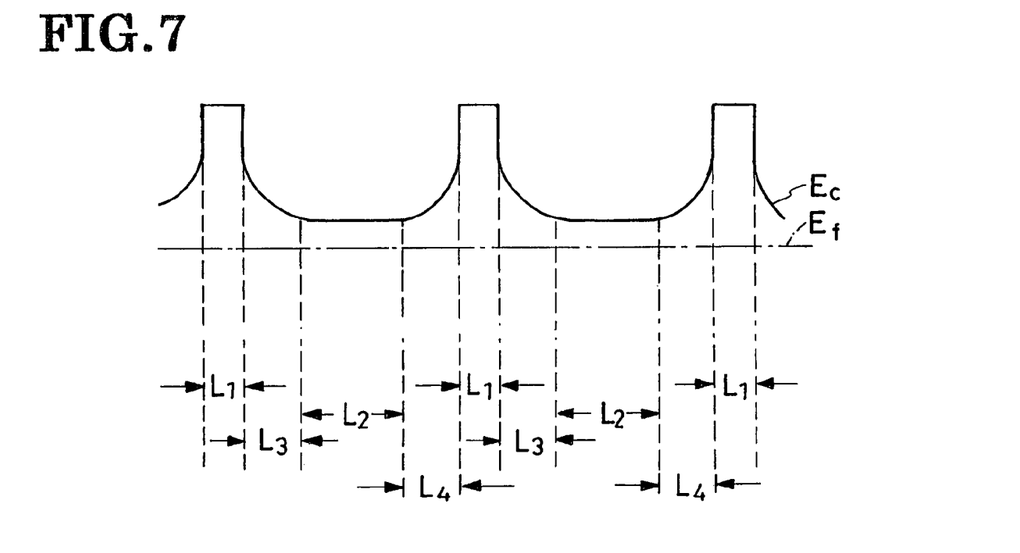
FIG. 7 is an energy band diagram of the buffer region of the improved substrate system of FIG. 6.

Embodiment of FIGS. 6 and 7

FIG. 6 cross-sectionally represents another preferred form of HEMT according to the invention. This alternative HEMT is built on a substrate system $1_a$ which differs from its FIG. 3 counterpart 1 in having a modified buffer region $3_a$ in the form of a lamination of buffer layers $5_a$. Each buffer layer $5_a$ includes a fourth buffer sublayer $L_4$ in addition to the first to third buffer sublayers $L_1$-$L_3$. A closer study of FIG. 6 will reveal that the fourth buffer sublayer $L_4$ is interposed between the first and second buffer sublayers $L_1$ and $L_2$ in each buffer layer $5_a$.

The fourth buffer sublayers $L_4$ are of a nitride semiconductor containing aluminum in a proportion which is intermediate the aluminum proportion a of the second buffer sublayers $L_2$ and the aluminum proportion x of the first buffer sublayers $L_1$. When the aluminum proportion a of the second buffer sublayers $L_2$ is zero, the aluminum proportion of the fourth buffer sublayers $L_4$ is a value intermediate zero and the aluminum proportion x of the first buffer sublayers $L_1$. The nitride semiconductor substances from which the fourth buffer sublayers $L_4$ can be generally expressed as:

$$Al_m M_n Ga_{1-m-n} N$$

where the capital M is at least either of indium and boron; the small letter m is greater than zero and less than one; n is equal to or greater than zero and less than one; (m+n) is equal to or less than one; and m is greater than a and less than x.

Preferred examples of the nitride materials for the fourth buffer sublayers $L_4$ are similar to those for the third buffer sublayers $L_3$, that is, AlGaN, AlInN, AlInGaN, AlBN, AlBGaN, and AlBInGaN. Particularly preferred is $Al_m Ga_{1-m} N$.

The fourth buffer sublayers $L_4$ are closer in lattice constant and thermal expansion coefficient to the silicon substrate proper 2 than are the second buffer sublayers $L_2$. The fourth buffer sublayers $L_4$ should be less in lattice constant than the second buffer sublayers $L_2$. Each fourth buffer sublayer $L_4$ should be from about 0.5 to about 50.0 nanometers thick. The main semiconductor region 4 would not be formed on the buffer region $3_a$ with a desired degree of levelness if the fourth buffer sublayers $L_4$ were each less than about 0.5 nanometer thick. If the fourth buffer sublayers $L_4$ were each more than about 50 nanometers thick, on the other hand, then the fourth buffer sublayers might develop cracks as a result of tensile stresses due to a difference in lattice constant from the second buffer sublayers $L_2$ and a difference in thermal expansion coefficient from the substrate proper 2.

The aluminum proportion m of each fourth buffer sublayer $L_4$ may be constant in its thickness direction but, preferably, and contrary to the showing of FIG. 3, drop linearly or stepwise from $P_1$ to $P_2$. It is also recommended that the aluminum proportion m of each buffer sublayer $L_4$ at or adjacent its junction with the underlying first buffer sublayer $L_1$ be the same as the aluminum proportion x of the first buffer sublayer, and that at or adjacent its junction with the overlying second buffer sublayer $L_2$ be the same as the aluminum proportion a of the second buffer sublayer. With the aluminum proportion m of each fourth buffer sublayer $L_4$ varied more or less linearly in its thickness direction as above, the mean aluminum proportion of each fourth buffer sublayer is intermediate the aluminum proportion x of each buffer sublayer $L_1$ and the aluminum proportion a of each second buffer sublayer $L_2$.

The sublayers of each buffer layer $5_a$ are successively grown epitaxially using the known MOCVD apparatus in the order of the first $L_1$, fourth $L_4$, second $L_2$ and third $L_3$. The same cycle of epitaxially growing one buffer layer $5_a$ is repeated a required number of times to create as many buffer layers in lamination and hence to create the buffer region $3_a$.

FIG. 7 shows the conduction band of the buffer region $3_a$ of the FIG. 6 substrate system $1_a$. The conduction band $E_c$ stays wholly above the Fermi level $E_f$, favorably preventing the generation of two-dimensional electron gas.

Figure 8:
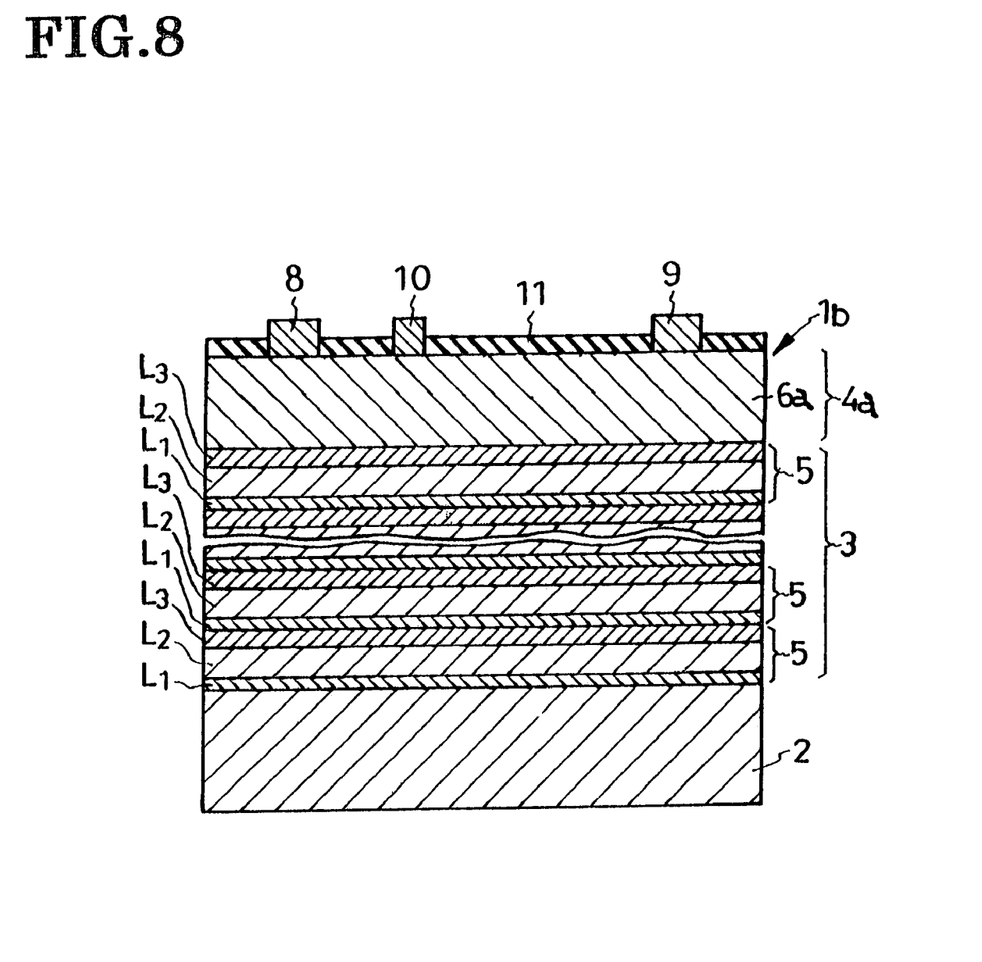
FIG. 8 is a view similar to FIG. 3 but showing a MESFET built on another preferred form of substrate system according to the invention.

Embodiment of FIG. 8

In FIG. 8 is shown still another substrate system $1_b$ which is akin to the FIG. 3 substrate system 1 except for a main semiconductor region $4_a$. Unlike the main semiconductor region 4 for HEMTs in the FIG. 3 substrate system 1, the main semiconductor region $4_a$ of this FIG. 8 embodiment takes the form of a single nitride semiconductor region $6_a$ suitable for fabrication of MESFETs. Preferably, the nitride semiconductor region $6_a$ is of GaN doped with silicon as an n-type impurity. This region $6_a$ is grown epitaxially on the buffer region 3 using the MOCVD apparatus. MESFETs are completed as the three electrodes 8-10 of each such element are formed on the n-type nitride semiconductor region $6_a$ via openings in the insulating film 11. The source 8 and drain 9 make ohmic contact with the semiconductor region $6_a$ whereas the gate 10 makes Schottky-barrier contact therewith.

The MESFETs thus formed on the improved substrate system $1_b$ gain the same advantages as do the HEMTs of the FIG. 3 configuration. Above all, current leakage from the MESFETs is drastically reduced as the invention succeeds in preventing the multilayered buffer region 3 from becoming too low in resistance to provide a current path.

Possible Modifications

Despite the foregoing detailed disclosure it is not desired that the present invention be limited by the exact showing of the attached drawings or the description thereof. The following is a brief list of possible modifications or alterations of the illustrated embodiments which are all believed to fall within the scope of this invention:

1. Insulated-gate field-effect transistors and other semiconductor elements other than HEMTs and MESFETs could be formed on substrate systems embodying the principles of this invention.

2. Another electron supply layer, in addition to that designated 7, could be interposed between buffer region 3 and electron transit layer 6 in the HEMT of FIG. 3.

3. The constituent layers of the nitride semiconductor layers 4 or $4_a$ for desired semiconductor elements could be fabricated from various gallium nitrides or indium nitrides, examples being GaN, AlInN, AlGaN, InGaN, and AlInGaN.

4. The constituent layers of the semiconductor layers 4 or $4_a$ could be of conductivity types opposite to those set forth above.

5. The baseplate or substrate proper 2 could be of polycrystalline silicon or silicon compounds such as silicon carbide.

What is claimed is:

1. A substrate system for fabrication of a semiconductor element, comprising:
    (a) a substrate proper having a major surface;
    (b) a buffer region formed on the major surface of the substrate proper, the buffer region being a lamination of a plurality of buffer layers, each buffer layer comprising:
        (i) a first buffer sublayer of a first nitride semiconductor containing aluminum in a first proportion;
        (ii) a second buffer sublayer of a second nitride semiconductor containing aluminum in a second proportion which is either zero or less than the first proportion, the second buffer sublayer being arranged next to the first buffer sublayer and farther away from the substrate proper than is the first buffer sublayer; and
        (iii) a third buffer sublayer of a third nitride semiconductor containing aluminum in a third proportion which is intermediate the first and the second proportion, the third buffer sublayer being arranged next to the second buffer sublayer and farther away from the substrate proper than is the second buffer sublayer; and
    (c) a main semiconductor region for a desired semiconductor element formed on the major surface of the substrate proper via the buffer region, the main semiconductor region having at least one nitride semiconductor layer.

2. The substrate system of claim 1 wherein the first nitride semiconductor constituting each first buffer sublayer of each buffer layer of the buffer region is expressed as $$Al_xM_yGa_{1-x-y}N$$

where M is at least either of indium and boron; x is greater than zero and equal to or less than one; y is equal to or greater than zero and less than one; and (x+y) is equal to or less than one;
    wherein the second nitride semiconductor constituting each second buffer sublayer of each buffer layer of the buffer region is expressed as $$Al_aM_bGa_{1-a-b}N$$

where M is at least either of indium and boron; a is equal to or greater than zero and less than one; b is equal to or greater than zero and equal to or less than one; (a+b) is equal to or less than one; and a is less than x; and
    wherein the third nitride semiconductor constituting the each third buffer sublayer of each buffer layer of the buffer region is expressed as $$Al_iM_jGa_{1-i-j}N$$

where M is at least either of indium and boron; i is greater than zero and less than one; j is equal to or greater than zero and less than one; (i+j) is equal to or less than one; and i is greater than a and less than x.

3. The substrate system of claim 2 wherein the aluminum proportion x in the formula expressing the first nitride semiconductor is equal to or more than 0.5, and wherein the aluminum proportion i in the formula expressing the third nitride semiconductor is equal to or less than 0.2.

4. The substrate system of claim 1 wherein the proportion of aluminum in each third nitride semiconductor gradually increases as each third buffer sublayer extends away from each second buffer sublayer.

5. The substrate system of claim 1 wherein each buffer layer of the buffer region further comprises a fourth buffer sublayer of a fourth nitride semiconductor containing aluminum in a fourth proportion which is intermediate the first and the second proportion, the fourth buffer sublayer being arranged intermediate the first and the second buffer sublayer.

6. The substrate system of claim 5 wherein the fourth nitride semiconductor constituting each fourth buffer sublayer of each buffer layer of the buffer region is expressed as $$Al_mM_nGa_{1-m-n}N$$

where M is at least either of indium and boron; m is greater than zero and less than one; n is equal to or greater than zero and less than one; (m+n) is equal to or less than one; and m is greater than a and less than x.

7. The substrate system of claim 5 wherein the proportion of aluminum in the fourth nitride semiconductor gradually decreases as each fourth buffer sublayer extends from the first toward the second buffer sublayer.

8. The substrate system of claim 2 wherein each buffer layer of the buffer region further comprises a fourth buffer sublayer of a fourth nitride semiconductor containing aluminum in a fourth proportion which is intermediate the first and the second proportion, each fourth buffer sublayer being arranged intermediate the first and the second buffer sublayer, wherein the fourth nitride semiconductor constituting each fourth buffer sublayer is expressed as $$Al_mM_nGa_{1-m-n}N$$

where M is at least either of indium and boron; m is greater than zero and less than one; n is equal to or greater than zero and less than one; (m+n) is equal to or less than one; and m is greater than a and less than x, wherein the aluminum proportion x in the formula expressing the first nitride semiconductor is equal to or more than 0.5, and wherein the aluminum proportion m in the formula expressing the fourth nitride semiconductor is equal to or less than 0.2.

9. The substrate system of claim 1 wherein each first buffer sublayer of each buffer layer of the buffer region is less in lattice constant than the second buffer sublayer, and wherein each third buffer sublayer of each buffer layer of the buffer region is intermediate in lattice constant between the first and the second buffer sublayer.

10. The substrate system of claim 1 wherein each first buffer sublayer of each buffer layer of the buffer region is from 0.5 to 50 nanometers thick, and wherein each second buffer sublayer is from 0.5 to 500 manometers thick.

11. The substrate system of claim 1 wherein the substrate proper comprises silicon or silicon compound.

12. A semiconductor element comprising:
    (a) a substrate proper having a major surface;
    (b) a buffer region formed on the major surface of the substrate proper, the buffer region being a lamination of a plurality of buffer layers, each buffer layer comprising:
        (i) a first buffer sublayer of a first nitride semiconductor containing aluminum in a first proportion;
        (ii) a second buffer sublayer of a second nitride semiconductor containing aluminum in a second proportion which is either zero or less than the first proportion, the second buffer sublayer being arranged next to the first buffer sublayer and farther away from the substrate proper than is the first buffer sublayer; and
        (iii) a third buffer sublayer of a third nitride semiconductor containing aluminum in a third proportion which is intermediate the first and the second proportion, the third buffer sublayer being arranged next to the second buffer sublayer and farther away from the substrate proper than is the second buffer sublayer;

(c) a main semiconductor region formed on the major surface of the substrate proper via the buffer region, the main semiconductor region having at least one nitride semiconductor layer;
(d) a first and a second main electrode in contact with the main semiconductor region; and
(e) a control electrode formed in contact with the main semiconductor region for controlling current flow between the first and the second main electrode.

13. The semiconductor element of claim 12 wherein the buffer layer of the buffer region further comprises a fourth buffer sublayer of a fourth nitride semiconductor containing aluminum in a fourth proportion which is intermediate the first and the second proportion, the fourth buffer sublayer being arranged intermediate the first and the second buffer sublayer.

14. The semiconductor element of claim 12 wherein the main semiconductor region is constituted of an electron transit layer and an electron supply layer, providing a high-electron-mobility transistor as the semiconductor element.

15. The semiconductor element of claim 12 wherein the main semiconductor region is constituted of a semiconductor layer for providing a metal-semiconductor-field-effect transistor as the semiconductor element.

* * * * *